United States Patent
Annichiarico et al.

(10) Patent No.: US 7,212,018 B2
(45) Date of Patent: May 1, 2007

(54) DUAL TIP PROBE

(75) Inventors: James Annichiarico, Hasbrouck Heights, NJ (US); Michael Mannino, Wayne, NJ (US)

(73) Assignee: LeCroy Corporation, Chestnut Ridge, NY (US)

( * ) Notice: Subject to any disclaimer, the term of this patent is extended or adjusted under 35 U.S.C. 154(b) by 0 days.

(21) Appl. No.: 10/970,192

(22) Filed: Oct. 21, 2004

(65) Prior Publication Data

US 2006/0087334 A1   Apr. 27, 2006

(51) Int. Cl.
*G01R 31/02*   (2006.01)

(52) U.S. Cl. ..................................... 324/754
(58) Field of Classification Search ............... 324/754, 324/761, 762, 765, 158.1, 73.1, 72.5; 439/92, 439/482, 98
See application file for complete search history.

(56) References Cited

U.S. PATENT DOCUMENTS

| 4,005,360 A | | 1/1977 | Ott |
| 4,721,903 A | * | 1/1988 | Harsch et al. ............. 324/72.5 |
| 4,923,407 A | * | 5/1990 | Rice et al. .................... 439/92 |
| 5,442,299 A | | 8/1995 | Caggiano |
| 5,505,710 A | | 4/1996 | Dorsey, III |
| 5,764,072 A | * | 6/1998 | Kister ......................... 324/754 |
| 6,276,956 B1 | | 8/2001 | Cook |
| 6,404,215 B1 | * | 6/2002 | Nightingale et al. ........ 324/754 |
| 6,519,860 B1 | | 2/2003 | Bieg et al. |
| 6,546,643 B2 | | 4/2003 | Lotze et al. |
| 6,550,926 B2 | | 4/2003 | Berger |
| 6,627,956 B2 | | 9/2003 | Asano et al. |
| 6,653,825 B2 | | 11/2003 | Nunniksma |
| 6,828,768 B2 | * | 12/2004 | McTigue .................... 324/72.5 |
| 6,838,893 B2 | * | 1/2005 | Khandros et al. ........... 324/754 |
| 6,949,919 B1 | * | 9/2005 | Cannon ..................... 324/72.5 |

* cited by examiner

*Primary Examiner*—Ha Tran Nguyen
*Assistant Examiner*—Tung X. Nguyen
(74) *Attorney, Agent, or Firm*—Frommer Lawrence & Haug LLP; William S. Frommer

(57) ABSTRACT

A locking mechanism and method for selectively fixing and allowing movement of a tip portion of a probe relative to a rigid portion of the probe are provided. The mechanism comprises a locking ball joint for selectively locking and allowing relative movement between the tip portion and the rigid portion and a sleeve about the ball joint. The locking ball joint is locked by the placement of the sleeve in a first position, thereby fixing the position of the tip portion relative to the rigid portion, and released by the placement of the sleeve in a second position, thereby allowing movement of the tip portion relative to the rigid portion.

9 Claims, 13 Drawing Sheets

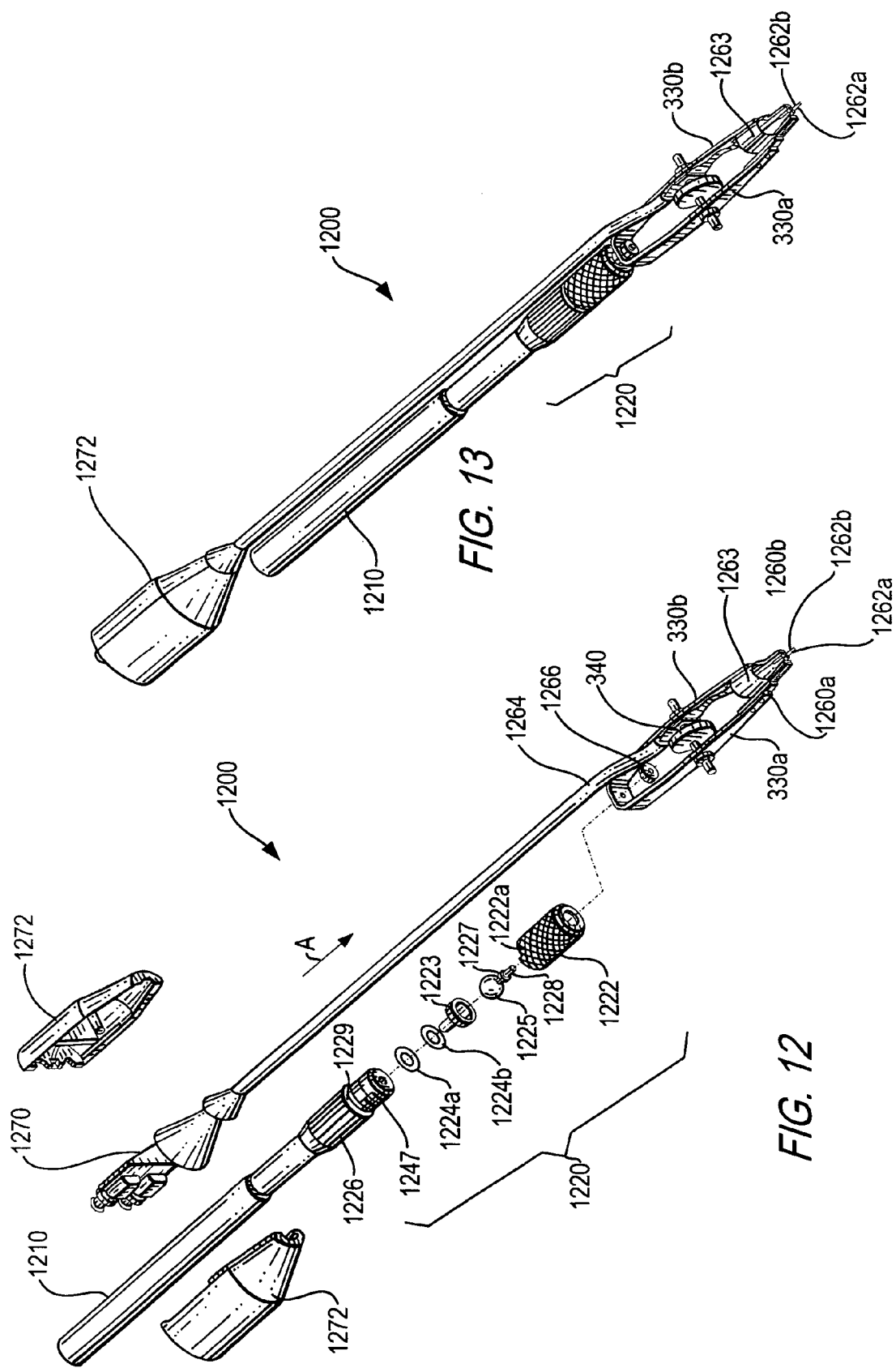

DUAL TIP PROBE

BACKGROUND OF THE INVENTION

This invention relates generally to test probes for use with electronic test equipment, and more particularly to a test probe that allows for hands-free operation, and which allows for substantial flexibility in positioning, but also allows for maintenance of a particular selected position.

Testing of various electrical components with electrical test probes coupled to electronic test equipment has traditionally been a hand-held job requiring substantial user skill and ability to repeat measurements. Typically, a user must touch two points of electrical components that are to be tested, each with a single lead test probe, to electrically couple the test points to the probes, and in turn to the electronic test equipment. This procedure requires both hands of a user, and therefore does not allow for the user to make any other adjustments to the test apparatus, or electrical component being tested. Additionally, it has been determined that the positioning of the test probe relative to the electronic part being tested is somewhat variable when being performed by hand, thus potentially resulting in different contact points and electrical coupling between different electrical components being tested and the test probes. This variation in coupling properties may have an impact on various test readings. Because the probes are hand held, the positioning thereof is not repeatable.

The inventors of U.S. Pat. No. 6,276,956 have addressed a number of these issues. For example, the probe described in this patent includes two tips that are provided with a selectable distance between them. Once selected, the distance is fixed so that a user may use a single hand to position both of the probe tips. Electrical conduits connected to the probe tips pass through a boot section that also covers a pivot point between two arms supporting the two probe tips. While improving on a number of the drawbacks of the procedure using two handheld probe tips noted above, the probe described in the '956 patent still has a number of significant drawbacks that have been identified by the inventors of the present invention.

It is therefore an object to provide an improved probe for overcoming the drawbacks of the prior art.

SUMMARY OF THE INVENTION

As noted above, the inventors of the present invention have determined a number of drawbacks of probes in the prior art. First, and most significantly, while the probe described in the '956 patent allows for the fixed positioning of two probe tips relative to each other, the probe unit is still hand held, and therefore the positioning of the probe tips with respect to an object to be tested is still quite variable, and dependent upon the technique employed by the user of the probe. Furthermore, because the electrical conduits pass through a portion of the probe adjacent the pivot point between the arms of the probe, some movement of the probe is inhibited. Thus, in addition to being subject to the particular technique of the user, the positioning of the electrical conduits may hinder precision placement of the probe tips.

In order to overcome these and other drawbacks of the prior art, the present invention includes a dual tip probe that allows for the precise relative positioning of the two probe tips. Additionally, the probe includes a rigid portion extending from an area where arms supporting the probe tips meet. This rigid portion is rotatably fixed to the arms, preferably by a selectively lockable ball joint or other freely rotatable locking mechanism. Electrical conduits are fixed to the arms in the area adjacent the probe tips, but are then routed away from the arms, ball joint and rigid portion so as to not interfere with the positioning of the probe tips and arms relative to the rigid portion.

In operation, the rigid portion of the probe is locked to a fixed or moveable holder that allows for precise and consistent positioning of the probe as a whole. Therefore, rather than merely providing precise positioning of the tips of the probe relative to each other, by appropriately locking in the rigid portion, and releasing the ball joint or other employed movement mechanism, positioning the probe tip arms, and locking the ball joint or other employed locking mechanism in place, the absolute position of the probe tips may also be fixed, and be guaranteed to be consistent between various measurements, therefore removing yet another source of variability in making measurements with probes Therefore, in accordance with the invention, an improved dual tip probe is provided that allows for more precise and repeatable positioning, therefore providing a more reliable data signal transmission through the probe.

Still other objects and advantages of the invention will in part be obvious and will in part be apparent from the specification and the drawings.

The invention accordingly comprises the several steps and the relation of one or more of such steps with respect to each of the others, and the apparatus embodying features of construction, combination(s) of elements and arrangement of parts that are adapted to effect such steps, all as exemplified in the following detailed disclosure, and the scope of the invention will be indicated in the claims.

BRIEF DESCRIPTION OF THE DRAWINGS

For a more complete understanding of the invention, reference is made to the following description and accompanying drawings, in which:

FIG. 12 is an exploded perspective view of a dual tip probe constructed in accordance with a fifth embodiment of the invention;

FIG. 13 is a perspective view of the dual tip probe of FIG. 12;

DETAILED DESCRIPTION OF THE PREFERRED EMBODIMENTS

Figure 2:
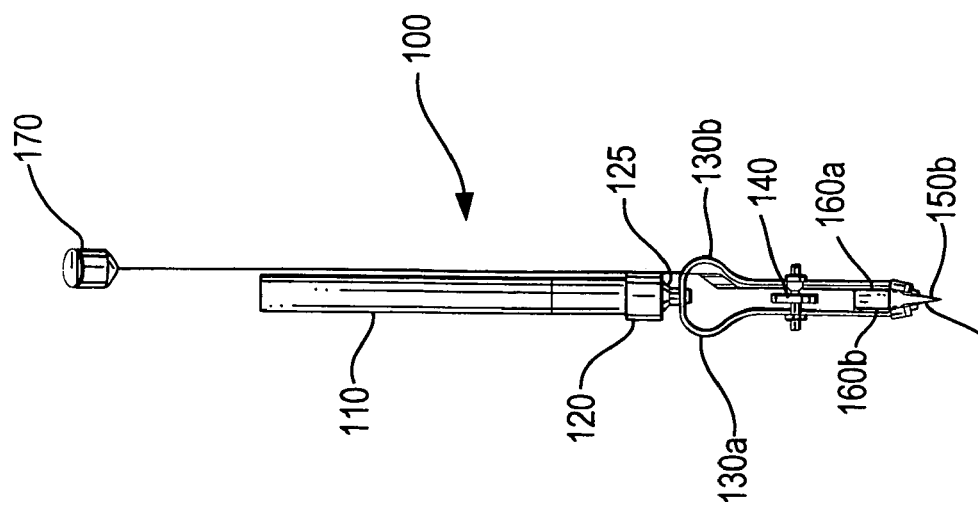
FIG. 2 is top plan view of the dual tip probe of FIG. 1.
Figure 1:
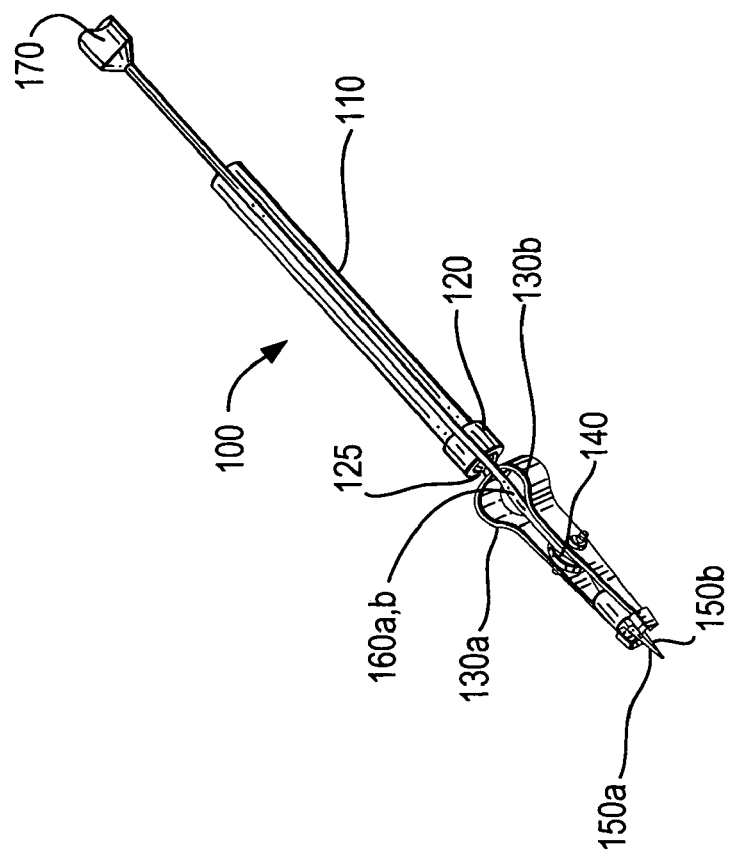
FIG. 1 is a perspective view of a dual tip probe constructed in accordance with a first embodiment of the invention.

Referring first to FIG. 1, a dual tip probe 100 constructed in accordance with a first embodiment of the invention is shown. Probe 100 includes a rigid member 110 having a proximate end and a distal end, and a pair of probe tips 150a, 150b. A locking mechanism 120 is fixed to the distal end of rigid member 110 and is operative to selectively lock the positioning of a joint 125. A pair of probe support arms 130a, 130b are in turn fixed to a selectively positionable portion of joint 125. These support arms meet at joint 125, and are shaped to support probe tips 150a, 150b in close proximity to each other. An arm positioning mechanism 140 selectively positions arms 130a, 130b relative to each other, and therefore in turn positions probe tips 150a, 150b relative to each other. Through the operation of arm position mechanism 140, this relative positioning between the probe tips may be adjusted. Finally, probe tips 150a, 150b are maintained in electrical contact with a standard connector 170 (which may be attached to any number of electronic test equipment) via flex circuits 160a, 160b. These flex circuits are fixed to arms 130a, 130b starting adjacent probe tips 150a, 150b for a distance, and are then separated therefrom, allowing for separate maneuverability of both the arms and the flex circuits. Similar features of probe 100 are shown in FIG. 2 from a different perspective.

Figure 3:
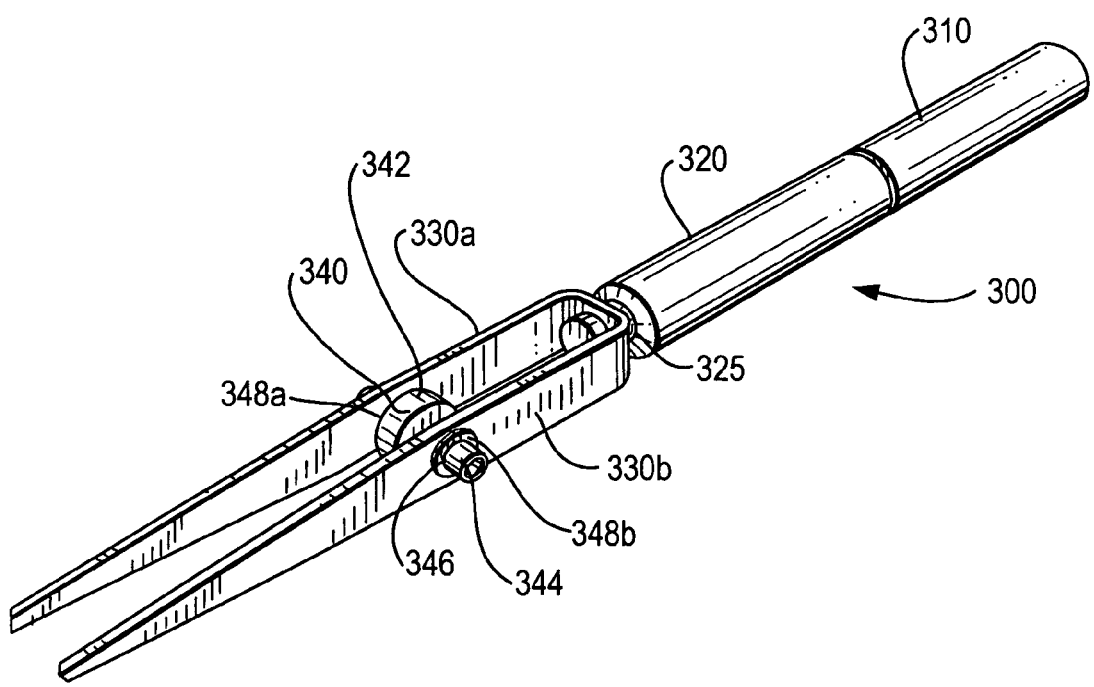
FIG. 3 is a perspective view of a dual tip probe constructed in accordance with a second embodiment of the invention.

Referring next to FIG. 3, a dual tip probe constructed in accordance with a second embodiment of the invention is shown. For clarity, the probe is shown without the probe tips, flex circuits, or standard connector thereon. However, it should be understood that these features are intended to be included similarly to those shown in FIGS. 1 and 2. As is shown in FIG. 3, a dual tip probe 300 includes a rigid member 310 having a proximate end and a distal end. A locking mechanism 320 is fixed to the distal end of rigid member 310 and is operative to selectively lock the positioning of a joint 325. A pair of probe support arms 330a, 330b are in turn fixed to a selectively positionable portion of joint 325. These support arms meet adjacent joint 325, and are shaped to support a pair of probe tips (not shown) in close proximity to each other. An arm positioning mechanism 340 selectively positions arms 330a, 330b relative to each other, and therefore in turn positions the probe tips relative to each other. Through the operation of arm position mechanism 340, this relative positioning between the probe tips may be adjusted.

While any arm positioning mechanism may be employed to fix the relative position of probe support arms 330a, 330b, in a preferred embodiment, a rotating dual threaded screw is employed. During use, a wheel 342 is rotated by a user in either free direction. Rotation in one direction causes arms 330a and 330b to move closer together while rotation in the other direction causes the arms to move away from each other. This movement is achieved as follows. A threaded shaft 344 is fixed to wheel 342, and therefore rotates with the wheel. Shaft 344 is threaded on each side of wheel 342 in opposite directions (not shown). Each thread engages one of a circular hole 348a, 348b, defined respectively by arms 330a, 330b. Thus, upon rotation of wheel 342, arms 330a, 330b are forced apart or together, depending upon the direction of rotation, in accordance with the movement of each arm in the corresponding thread formed in shaft 344.

Figure 4:
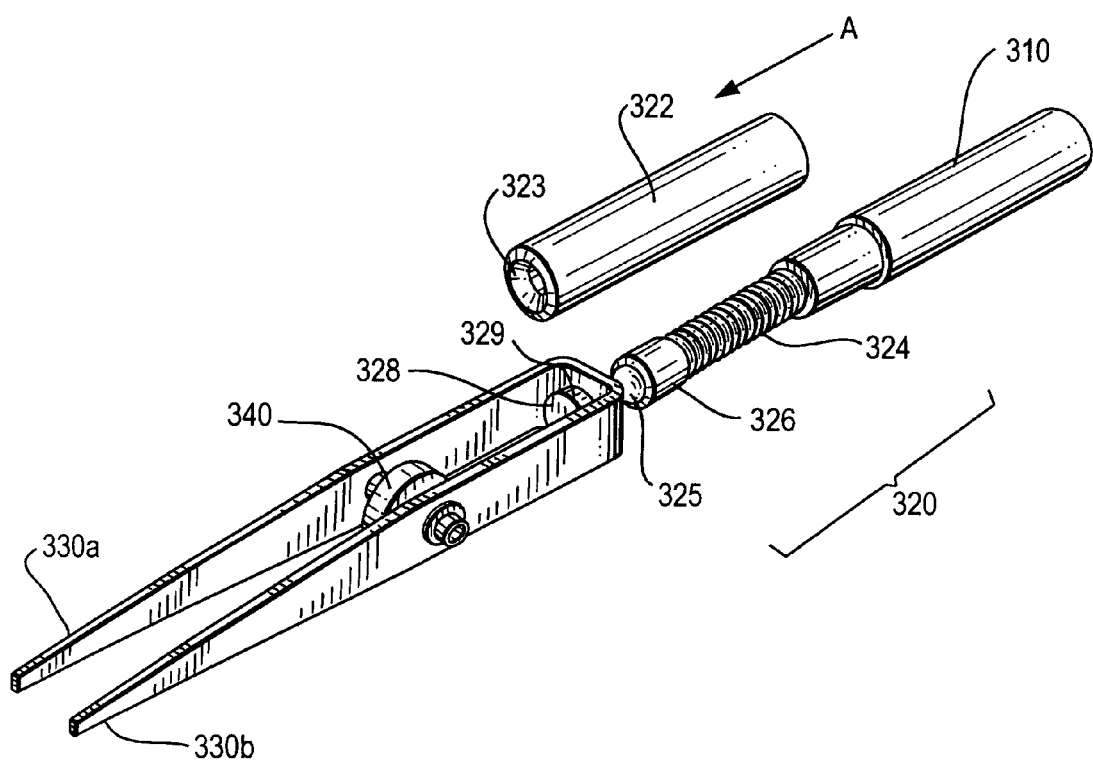
FIG. 4 is partially exploded perspective view of the dual tip probe of FIG. 3.
Figure 5:
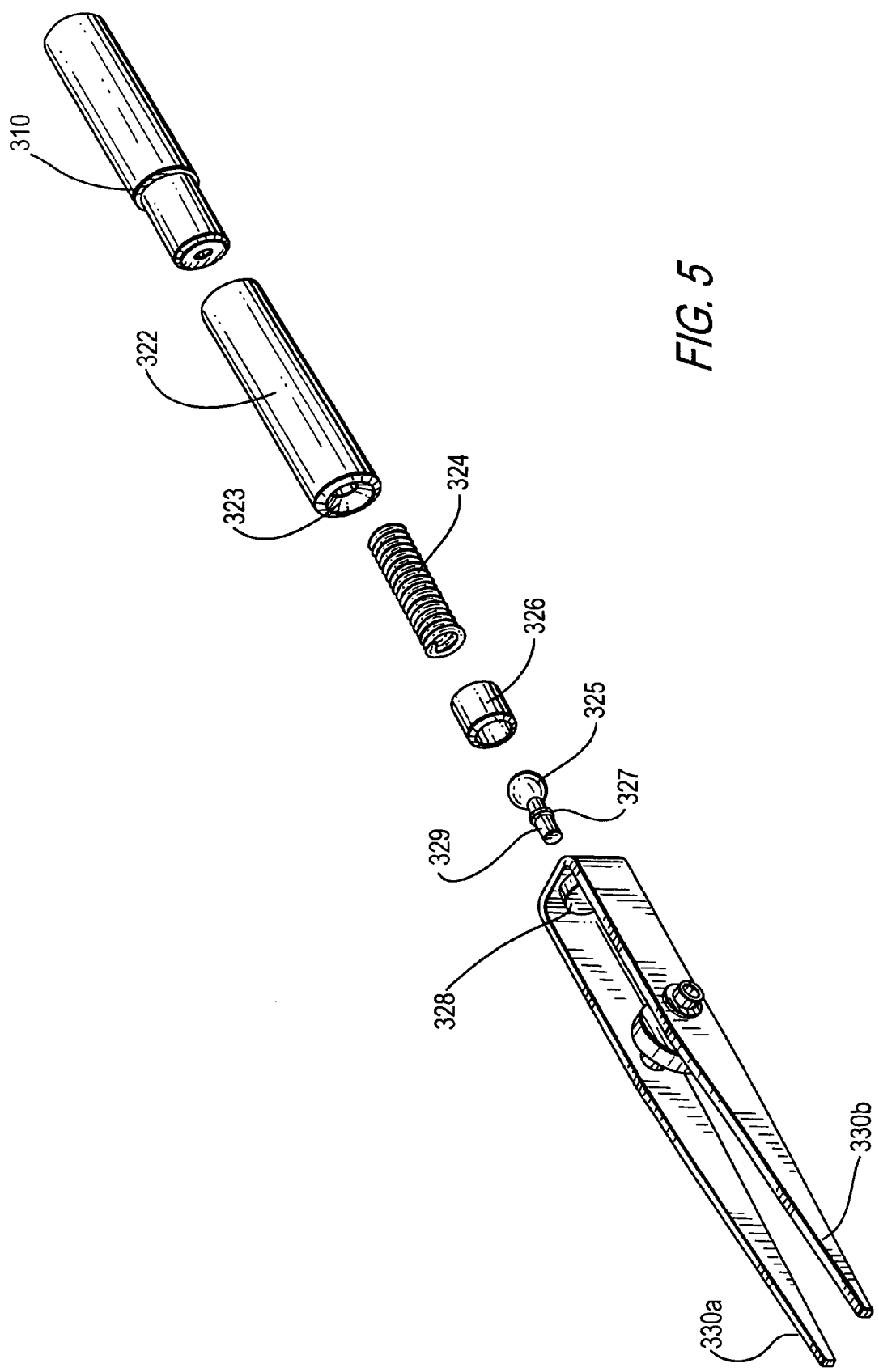
FIG. 5 is an exploded perspective view of the dual tip probe of FIG. 3.

Referring next to FIGS. 4 and 5, joint 325 will be described in greater detail. As is shown in FIG. 4, locking member 320 further comprises a sleeve 322, a spring 324, and a receiver 326 for receiving ball joint 325. Sleeve 322 is formed with a beveled edge 323 defining a hole therein. The beveled edge is contoured so as to allow receiver 326 to receive ball joint 325 an keep the ball joint therein, while allowing for a sufficient range of motion of an extension 329 of ball joint 325. A ridge 327 is formed on extension 329, which, in conjunction with press fit bushing 328 sandwiches a portion of arms 330a, 330b so as to fix the position of the arms relative to shaft 329 of ball joint 325. Thus any repositioning of ball joint 325 will result in a corresponding change in the position of the arms.

During operation, as is shown in FIG. 4, ball joint 325 is fitted into receiver 326, which is in turn placed adjacent spring 324. Sleeve 322 encases receiver 326 and spring 324, as well as the distal end of member 310. Spring 324 biases sleeve 322 in the direction opposite that indicated by arrow A when not in use. This biasing force also locks the position of the ball joint relative to member 310. To unlock the position of ball joint 325, a force is exerted by a user on sleeve 322 in a direction indicated by arrow A, and therefore against the biasing force of spring 324. After this movement, ball joint 325 is free to rotate and move to be repositioned in any desired position. After the appropriate position has been determined, the force on sleeve 322 is removed and the biasing force of spring 324 once again locks the position of ball joint 325.

While rigid member 310 is shown as a single piece, adapted to be fixed in a stationary or adjustable holder, the invention is not limited to such a configuration. Rather, member 310 may be formed as a telescoping member. Thus, member 310 may extend in length along its axis in order to aid in the positioning of probe 300. This telescoping mechanism may be one, such as a standard radio antenna, where a user pulls on the end of the telescoping member to extend it, and pushes on the end of the telescoping member to retract it. Alternatively, any number of mechanized extension/retraction schemes may be employed, such as an automatically extending/retracting car antenna, a double threaded internal member such as that employed in extending/retracting a lens in a camera, or the like. This mechanized telescoping ability is particularly useful in a fully automated testing environment. Thus, rather than having a user position the probe assembly, the probe assembly may be first extended in accordance with the telescoping member, and thereafter the direction of the probe arms and tips may be adjusted as noted above. Various other schemes for positioning the rigid member of the probe may also be employed.

Similarly, while the force indicated in FIG. 4 used to unlock the ball joint is described as being imparted by a user, any appropriate form of mechanized or automatic release may be employed. Further, any type of locking mechanism may be employed, as may be dictated by the requirements of a particular application. It is only imperative that the position of the probe be selectively moveable and be able to be fixed in relation to member 310.

Figure 6:
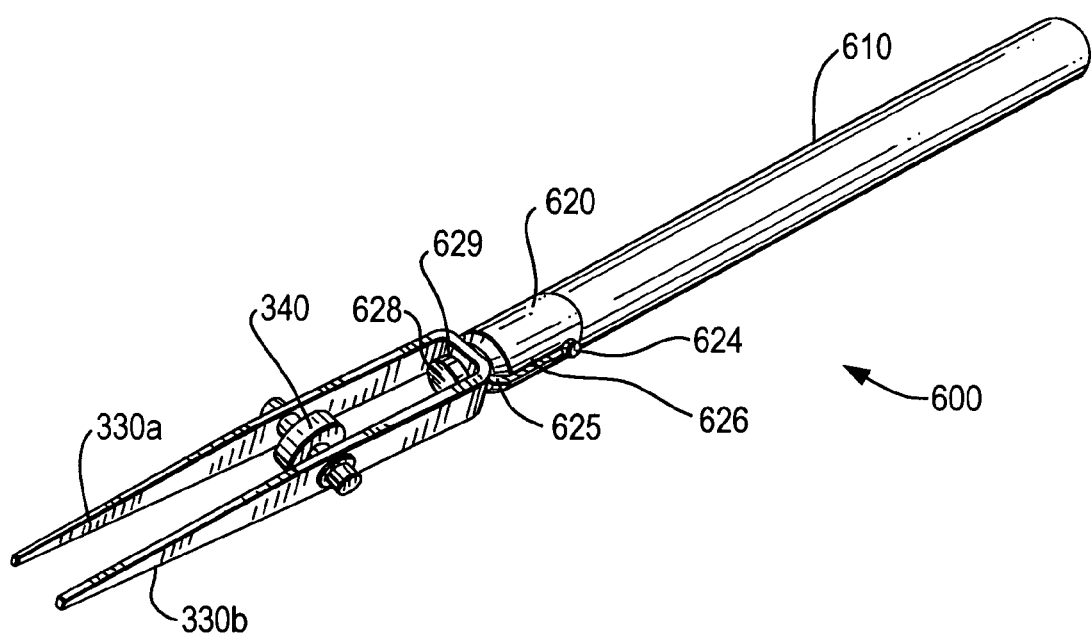
FIG. 6 is a perspective view of a dual tip probe constructed in accordance with a third embodiment of the invention.

Referring next to FIG. 6, a dual tip probe constructed in accordance with a third embodiment of the invention is shown. As in FIG. 3, for clarity, the probe is shown without the probe tips, flex circuits, or standard connector thereon. However, it should be understood that these features are intended to be included similarly to those shown in FIGS. 1 and 2. As is shown in FIG. 6, a dual tip probe 600 includes a rigid member 610 having a proximate end and a distal end. A locking mechanism 620 is fixed to the distal end of rigid member 610 and is operative to selective lock the positioning of a joint 625. A pair of probe support arms 330a, 330b are in turn fixed to a selectively positionable portion of joint 625. These support arms meet adjacent joint 625, and are shaped to support a pair of probe tips (not shown) in close proximity to each other. Arm positioning mechanism 340 selectively positions arms 330a, 330b relative to each other, and therefore in turn positions the probe tips relative to each other. Through the operation of arm position mechanism 340, this relative positioning between the probe tips may be adjusted. While any arm positioning mechanism may be employed to fix the relative position of probe support arms 330a, 330b, in a preferred embodiment, a rotating threaded screw having a left-handed thread on one side of the wheel and a right-handed threaded screw on the other side of the wheel is employed, and operates similarly to the mechanism described with respect to FIG. 3.

Figure 7:
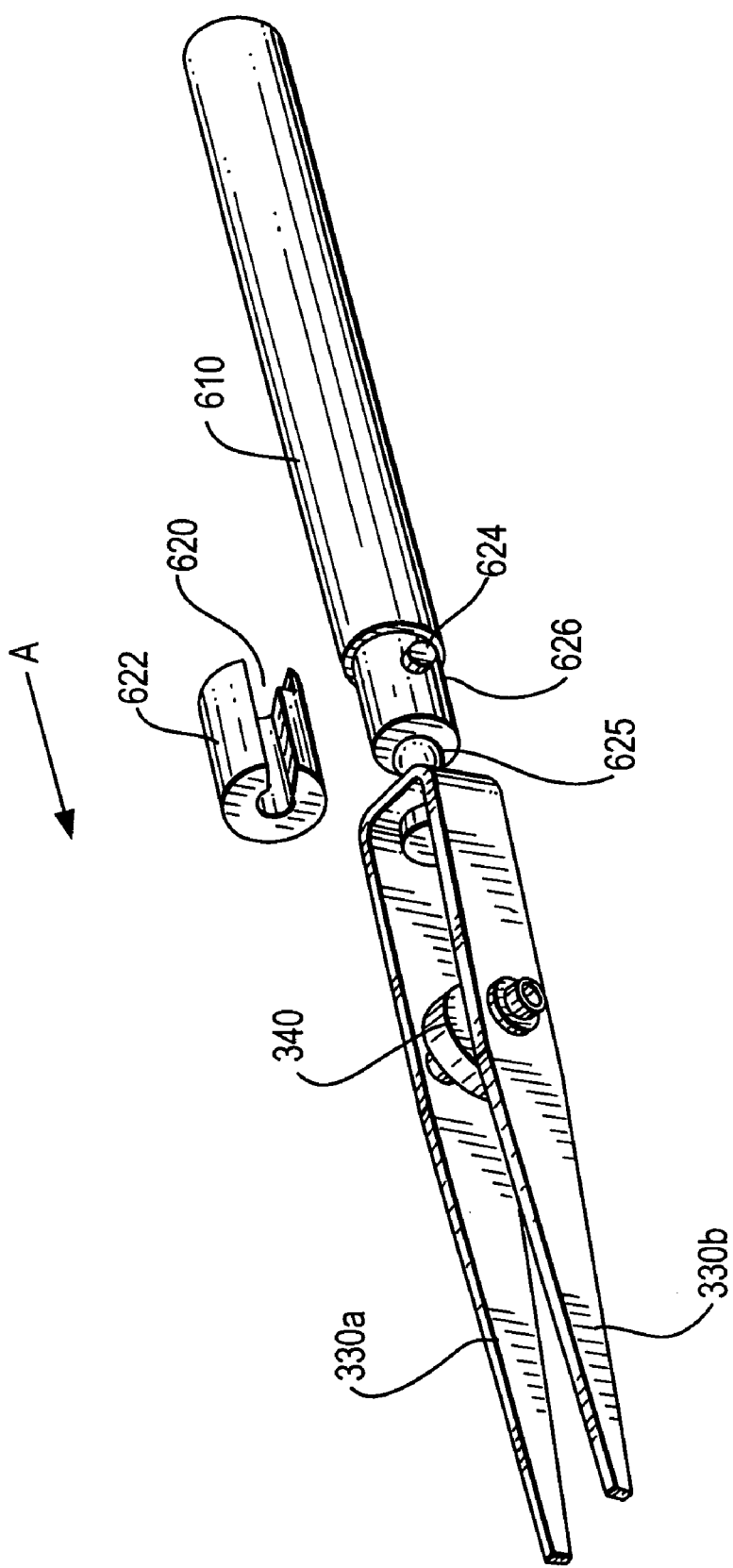
FIG. 7 is partially exploded perspective view of the dual tip probe of FIG. 6.
Figure 8:
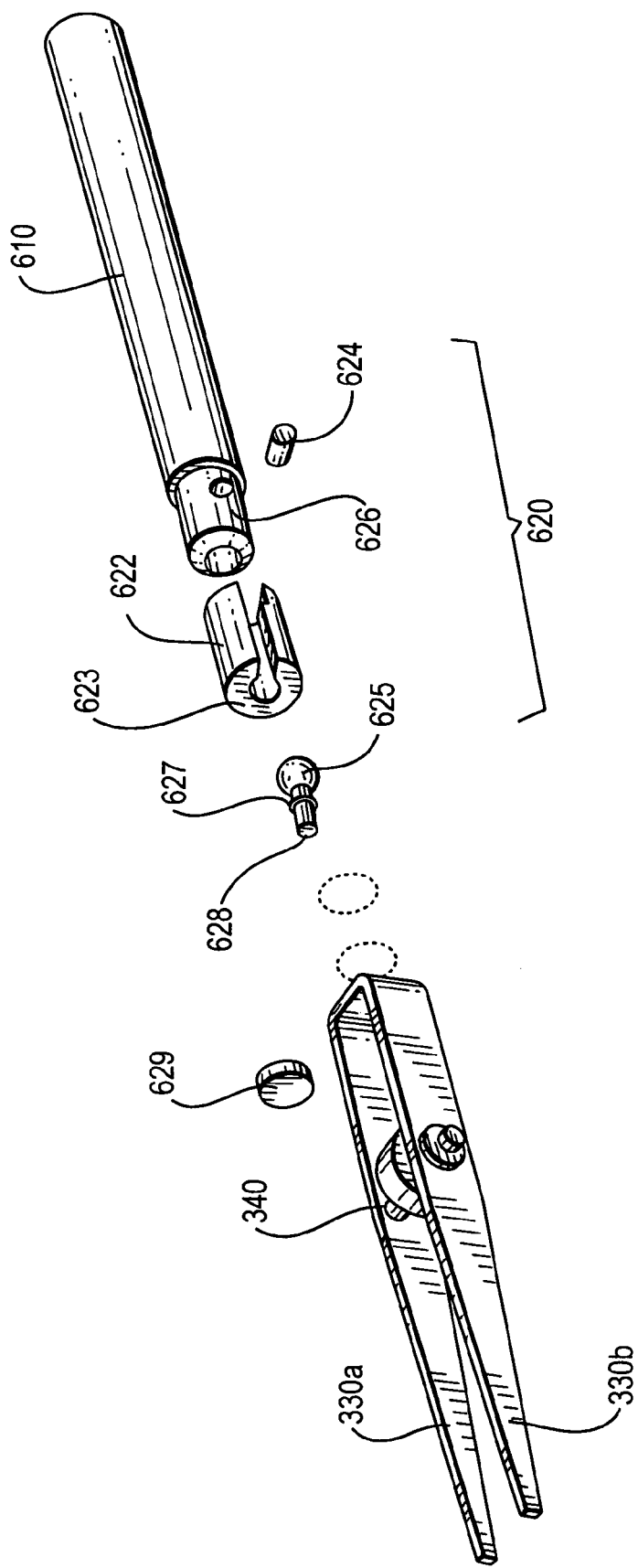
FIG. 8 is an exploded perspective view of the dual tip probe of FIG. 6.

Referring next to FIGS. 7 and 8, joint 325 will be described in greater detail. As is shown in FIG. 7, locking member 620 further comprises a sleeve 622, a locking pin 624, and a receiver 626 for receiving ball joint 625. Sleeve 622 is formed with a beveled edge 623 defining a hole therein. The beveled edge is contoured so as to allow receiver 626 to receive ball joint 625 an keep the ball joint therein, while allowing for a sufficient range of motion of an extension 629 of ball joint 625. A ridge 627 is formed on extension 629, which, in conjunction with press fit bushing 628 sandwiches a portion of arms 330a, 330b so as to fix the position of the arms relative to shaft 629 of ball joint 625. Thus any repositioning of ball joint 625 will result in a corresponding change in the position of the arms.

During operation, as is shown in FIGS. 7 and 8, ball joint 625 is fitted into receiver 626. Sleeve 622 encases receiver 626, and has its position relative thereto fixed by locking pin 624. Locking pin 624 locks and biases sleeve 622 in the direction opposite that indicated by arrow A when not in use. This biasing force also locks the position of the ball joint relative to member 610. To unlock the position of ball joint 625, sleeve 622 is rotated so that the locking pin is placed in line with a groove 630 defined by sleeve 622, thereby allowing sleeve 622 to travel in a direction indicated by arrow A, and in turn releasing the lock on ball joint 625. After this movement, ball joint 625 is free to rotate and move to be repositioned in any desired position. After the appropriate position has been determined, sleeve 622 is moved back to its original resting position and the force imparted on the ball joint once again locks the position of ball joint 325.

Similarly to FIGS. 3–5, any appropriate arm position mechanism 340 and telescoping or other appropriate member 610 may be employed.

Figure 9:
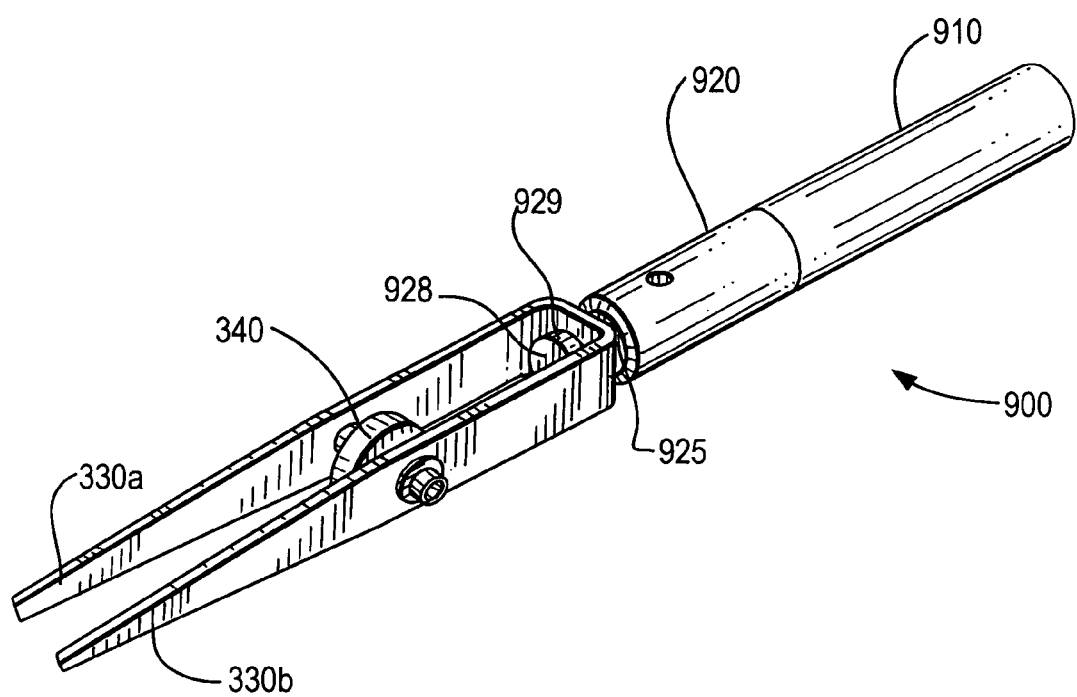
FIG. 9 is a perspective view of a dual tip probe constructed in accordance with a fourth embodiment of the invention.

Referring next to FIG. 9, a dual tip probe constructed in accordance with a fourth embodiment of the invention is shown. As in FIG. 3, for clarity, the probe is shown without the probe tips, flex circuits, or standard connector thereon. However, it should be understood that these features are intended to be included similarly to those shown in FIGS. 1 and 2. As is shown in FIG. 9, a dual tip probe 900 includes a rigid member 910 having a proximate end and a distal end. A locking mechanism 920 is fixed to the distal end of rigid member 610 and is operative to selective lock the positioning of a joint 925. A pair of probe support arms 330a, 330b are in turn fixed to a selectively positionable portion of joint 925. These support arms meet adjacent joint 925, and are shaped to support a pair of probe tips (not shown) in close proximity to each other. Arm positioning mechanism 340 selectively positions arms 330a, 330b relative to each other, and therefore in turn positions the probe tips relative to each other. Through the operation of arm position mechanism 340, this relative positioning between the probe tips may be adjusted. While any arm positioning mechanism may be employed to fix the relative position of probe support arms 330a, 330b, in a preferred embodiment, a rotating threaded screw having a left-handed thread on one side of the wheel and a right-handed threaded screw on the other side of the wheel is employed, and operates similarly to the mechanism described with respect to FIG. 3.

Figure 10:
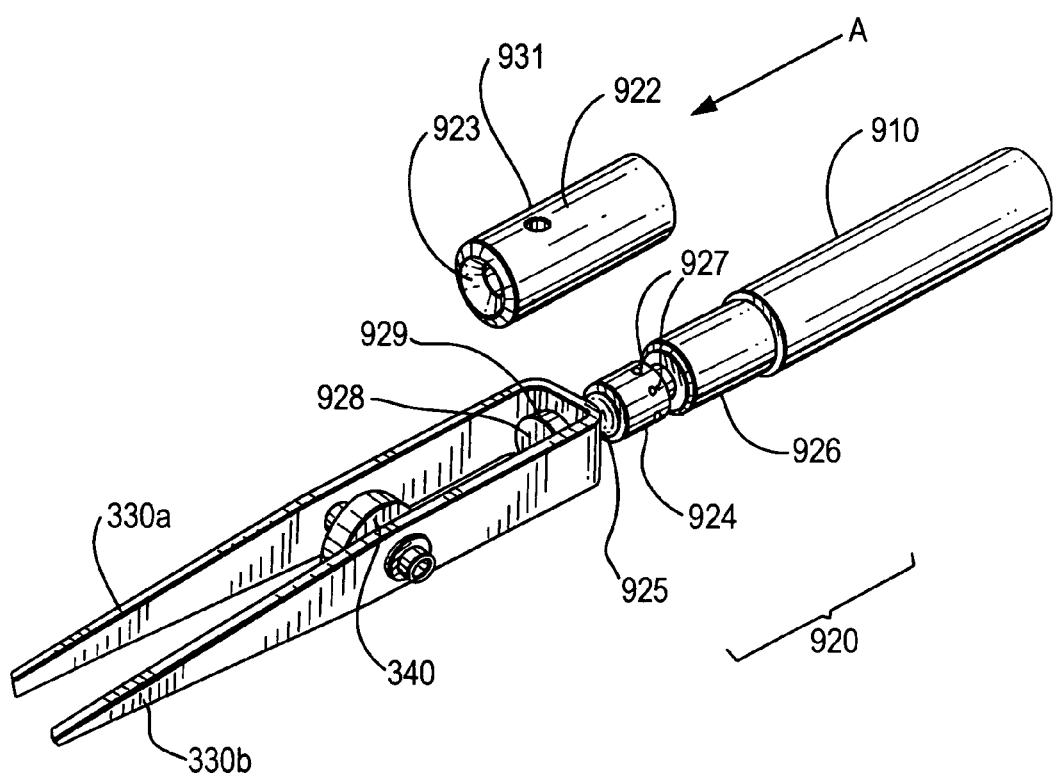
FIG. 10 is partially exploded perspective view of the dual tip probe of FIG. 9.
Figure 11:
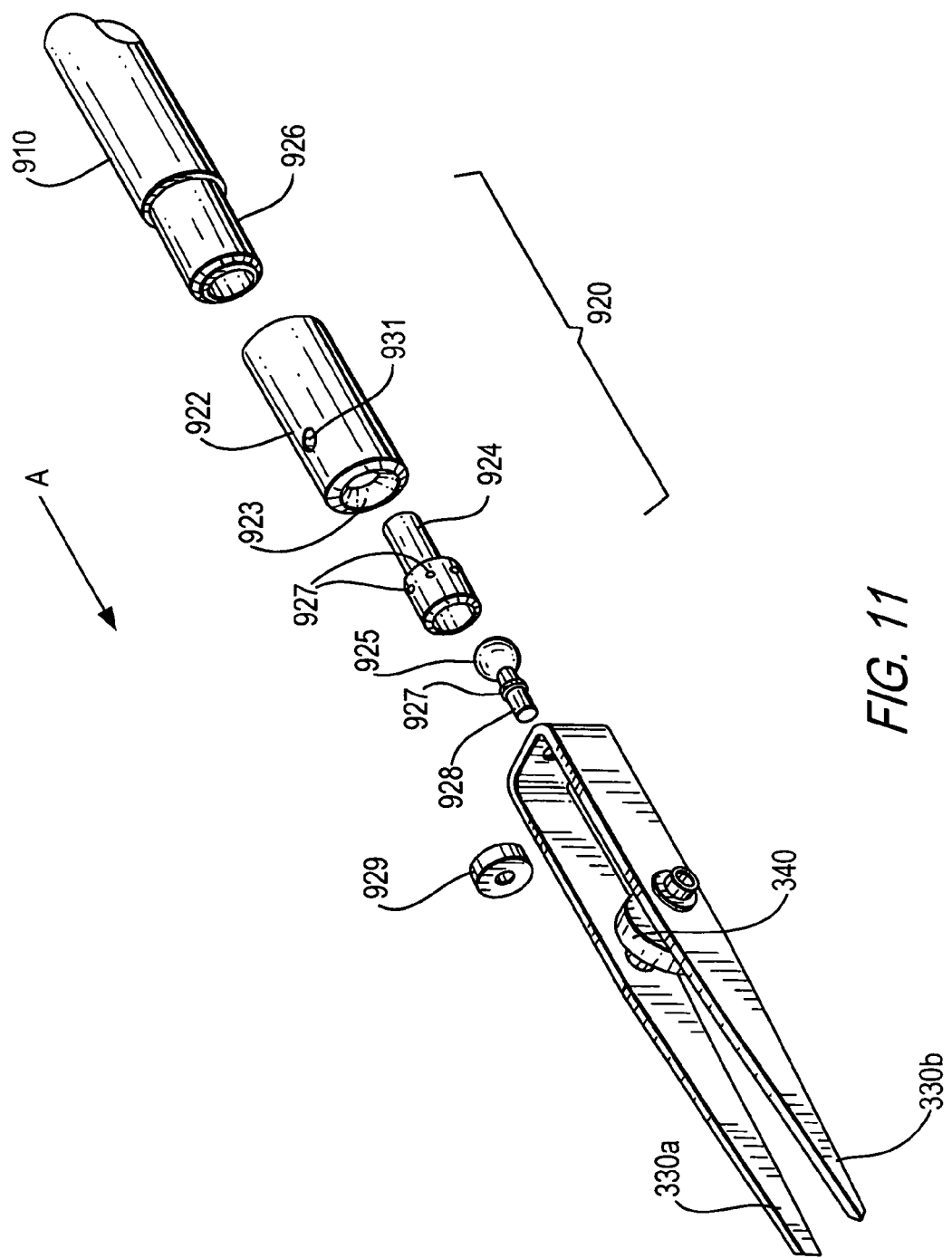
FIG. 11 is an exploded perspective view of the dual tip probe of FIG. 9.

Referring next to FIGS. 10 and 11, joint 925 will be described in greater detail. As is shown in FIG. 10, locking member 920 further comprises a sleeve 922, a locking receiver 924 for receiving ball joint 925 and for selectively fixing a position of sleeve 922 relative to the ball joint, and a receiver 926 for receiving locking receiver 924. Sleeve 922 is formed with a beveled edge 923 defining a hole therein. The beveled edge is contoured so as to allow receiver 926 to receive ball joint 925 an keep the ball joint therein, while allowing for a sufficient range of motion of an extension 929 of ball joint 925. A ridge 927 is formed on extension 929, which, in conjunction with press fit bushing 928 sandwiches a portion of arms 330a, 330b so as to fix the position of the arms relative to shaft 929 of ball joint 925. Thus any repositioning of ball joint 925 will result in a corresponding change in the position of the arms.

During operation, as is shown in FIGS. 10 and 11, ball joint 6925 is fitted into locking receiver 924. Sleeve 922 encases locking receiver 924 as well as receiver 926, and has its position relative to locking receiver 924 fixed by one of a plurality of locking bearings 927 being retained in a hole 931 defined by sleeve 922. One of the locking bearings 927 locks and biases sleeve 922 in the direction opposite that indicated by arrow A when not in use. This biasing force also locks the position of the ball joint relative to member 910. To unlock the position of ball joint 925, sleeve 922 is forced in the direction denoted by arrow A, depressing the corresponding locking bearing from out of hole 931, and allowing for the free movement of sleeve 922 to travel in a direction of arrow A, and in turn releasing the lock on ball joint 925. After this movement, ball joint 925 is free to rotate and move to be repositioned in any desired position. After the appropriate position has been determined, sleeve 922 is moved back to its original resting position and the force imparted on the ball joint once again locks the position of ball joint 325.

Similarly to FIGS. 3–8, any appropriate arm position mechanism 340 and telescoping or other appropriate member 610 may be employed.

Referring next to FIGS. 12 and 13, a dual tip probe constructed in accordance with a fifth embodiment of the invention is shown. As is shown in FIG. 12, a dual tip probe 1200 includes a rigid member 1210 having a proximate end and a distal end. A locking mechanism 1220 is fixed to the distal end of rigid member 1210 and is operative to selectively lock the positioning of a joint 1225. A pair of probe support arms 330a, 330b are in turn fixed to a selectively positionable portion of joint 1225. These support arms meet at joint 1225, and are shaped to support a pair of probe tips (1262a, 1262b) in close proximity to each other. Arm positioning mechanism 340 selectively positions arms 330a, 330b relative to each other, and therefore in turn positions the probe tips relative to each other. Through the operation of arm position mechanism 340, this relative positioning between the probe tips may be adjusted. While any arm positioning mechanism may be employed to fix the relative position of probe support arms 330a, 330b, in a preferred embodiment, a rotating threaded screw having a left-handed thread on one side of the wheel and a right-handed threaded screw on the other side of the wheel is employed, and operates similarly to the mechanism described with respect to FIG. 3.

Joint 1225 will now be described in greater detail. As is shown in FIG. 12, locking member 1220 further comprises a sleeve 1222 that may be threadably coupled to a threaded receiving portion 1247 of member 1210. Retained between sleeve 1222 and threaded portion 1247 are a receiver 1223 for receiving a ball joint 1225 and for retaining spring members 1224a, 1224b. Ball joint 1225 is formed with ridge 1227 on an extension 1228, which, in conjunction with a press fit bushing 1266 sandwiches a portion of arms 330a, 330b so as to fix the position of the arms relative to shaft 1228 of ball joint 1225. Thus any repositioning of ball joint 1225 will result in a corresponding change in the position of the arms. Sleeve 1222 and a portion 1226 of member 1210 adjacent threaded portion 1247 are preferably formed with a grip-enhancing surface.

During operation, ball joint 1225 is fitted into receiver 1223. Sleeve 1222 encases receiver 1223 and ball joint 1225, as well as receiver spring members 1224a, 1224b. Sleeve 1222 further defines a recess 1222a that, when sleeve 1222 is threadably coupled with threaded portion 1247, limits the position of sleeve 1222 by the interaction of recess 1222a with a motion limiting pin 1229. Spring members 1224a, 1224b bias sleeve 1222 in the direction indicated by arrow A. This biasing force also locks the position of the ball joint relative to member 1210. To unlock the position of ball joint 1225, sleeve 1222 is rotated in a direction so that sleeve 1222 moves in the direction of arrow A relative to member 1210, thereby releasing the pressure on receiver 1223 imparted by spring members 1224a, 1224b, and therefore in turn freeing ball joint 1225. The movement of sleeve 1222 is limited by limiting pin 1229 retained in recess 1222a defined by sleeve 1222, thereby limiting the angle of rotation of sleeve 1222. Once released, ball joint 1225 is free to rotate and move to be repositioned in any desired position. After the appropriate position has been determined, sleeve 1222 is rotated in an opposite direction, and moved back to its original resting position. The force imparted on the ball joint by spring members 1224a, 1224b once again locks the position of ball joint 1225.

As noted above, probe 1200 is preferably fitted with an electronic circuit for transferring electric signals sensed by the probe tips to a coupled apparatus. As is shown in FIGS. 12 and 13, a circuit 1264 having one end terminating adjacent probe tips 1262a, 1262b, and another end terminating in the vicinity of member 1210 is provided. The end of circuit 1264 terminating adjacent member 1210 includes an electronic coupler 1270 for coupling to an external device, and a coupler housing 1272. Adjacent probe tips 1262a, 1262b, the electronic circuit is routed along an inner surface of one of arms 330a, 330b. The positioning of this circuit and probe tips will be described with reference to FIGS. 14 and 15.

Figure 14:
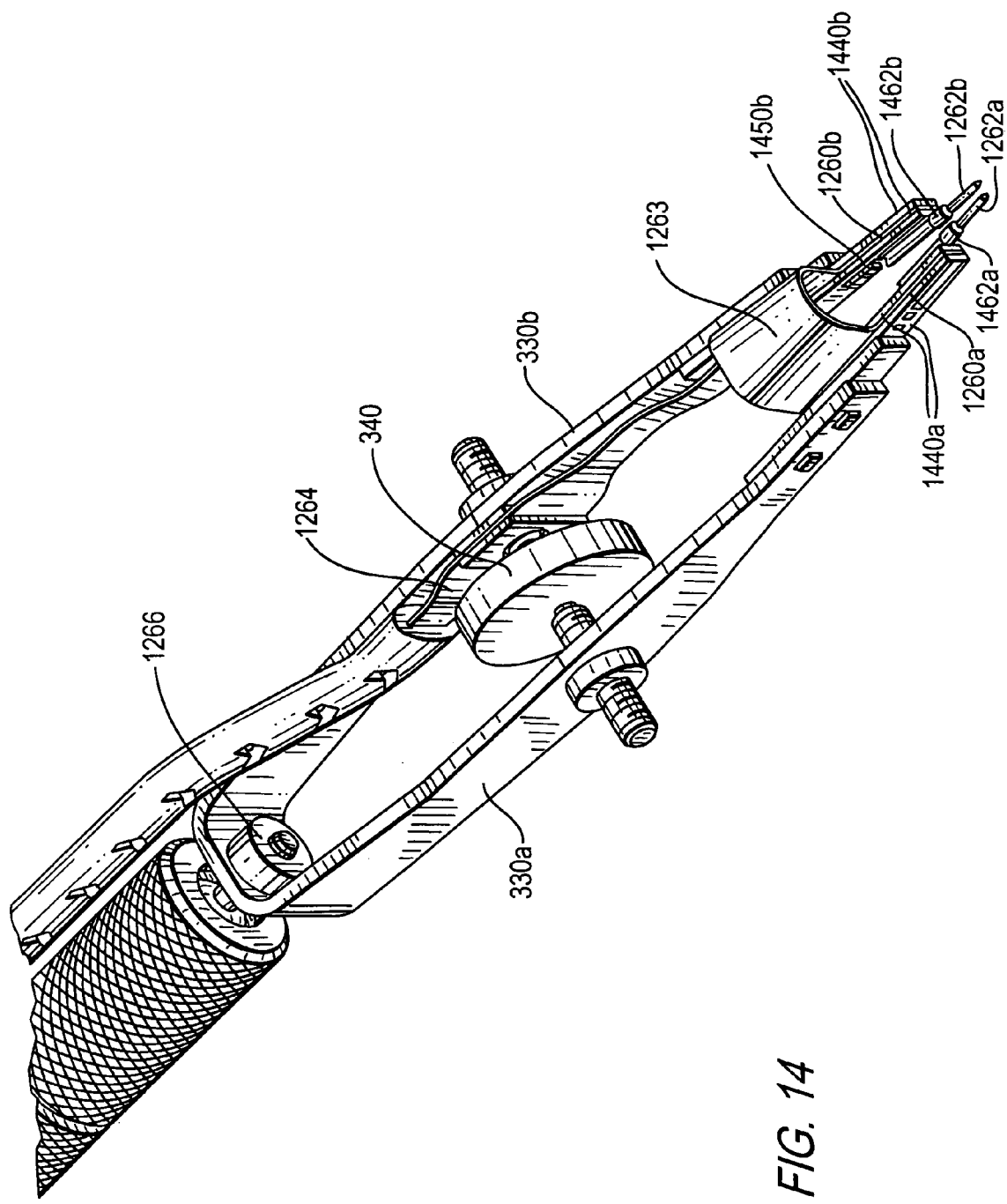
FIG. 14 is a perspective view of a probe tip of the probe of FIG. 13.

As shown in FIG. 14, electrical circuit 1264 extends along the inner surface of arm 330b. Along its path, a flex bridge portion 1263 extends to the other arm 330a, thus placing circuitry along both arms. The circuitry further extends, and is held in place by rigid portions 1440a, 1440b, which are attached respectively to arms 330a, 330b. The circuits are further placed in electrical contact with respective probe tips 1262a, 1262b, as held by retaining portions 1462a, 1462b via resistors 1450a (not shown), 1450b. In this manner, the probe tips are placed in electrical contact with coupler 1270, and a connected external device.

Figure 15:
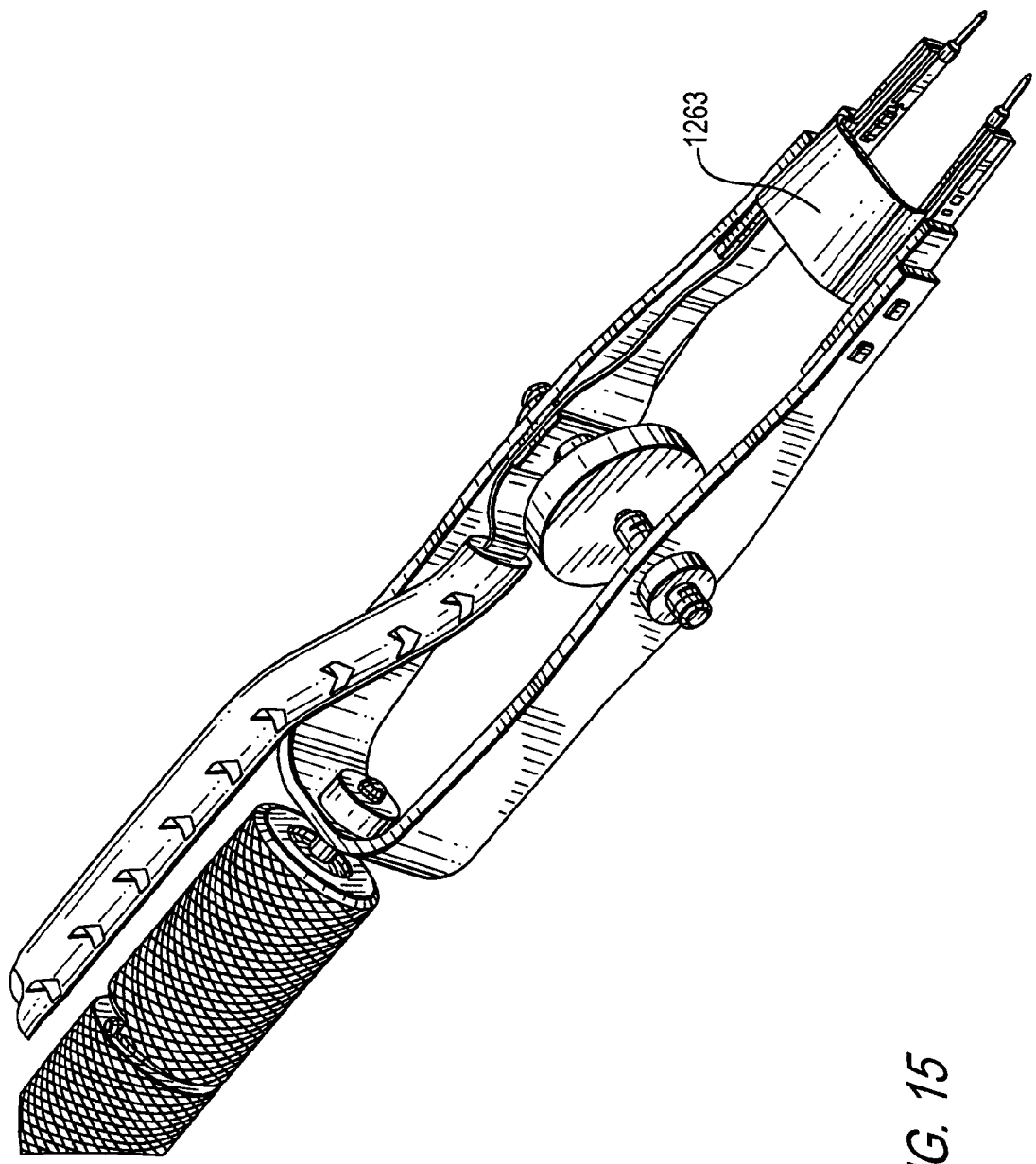
FIG. 15 is a perspective view of a probe tip of the probe of FIG. 13.

As is shown in FIG. 14, flexible bridge portion 1263 allows for the relative movement of arms 330a, 330b, without affecting the electrical properties of the probe. Thus, as is shown, as the probe tips are separated, the bridge portion simply flattens out between the arms. A probe in such a form is shown in FIG. 15, depicting the bridge portion flattened out between two arms positioned further away from each other.

Similarly to FIGS. 3–8, any appropriate arm position mechanism 340 and telescoping or other appropriate member 610 may be employed.

It will thus be seen that the objects set forth above, among those made apparent from the preceding description, are efficiently attained and, because certain changes may be made in carrying out the above method and in the construction(s) set forth without departing from the spirit and scope of the invention, it is intended that all matter contained in the above description and shown in the accompanying drawings shall be interpreted as illustrative and not in a limiting sense.

It is also to be understood that the following claims are intended to cover all of the generic and specific features of the invention herein described and all statements of the scope of the invention which, as a matter of language, might be said to fall therebetween.

What is claimed:

1. A probe, comprising:

A rigid portion for supporting the probe;

A tip portion comprising two electrically conductive tips for contacting a test sample;

A locking mechanism for selectively fixing and allowing rotational movement of the tip portion relative to the rigid portion;

A tip positioning mechanism for selectively positioning the two electrically conductive tips relative to each other;

A flexible circuit in electrical contact with each of the two electrically conductive tips; and A bridge portion of the flexible circuit for allowing the flexible circuit to bridge the space between the two electrically conductive tips.

2. The probe of claim 1, wherein the bridge portion of the flexible circuit is deformable upon a change in the relative positioning between the two electrically conductive tips.

3. The probe of claim 1, wherein the locking mechanism comprises a locking ball joint.

4. The probe of claim 3, wherein the locking ball joint is locked by the placement of a sleeve about the ball joint in a first position, and released by the placement of the sleeve about the ball joint in a second position.

5. The probe of claim 4, wherein the sleeve is moved relative to the ball joint in accordance with a threaded portion of the sleeve engaging a complimentarily threaded portion of the rigid portion.

6. The probe of claim 4, wherein a force is imparted to lock the ball joint when the sleeve is in the first position by a spring mechanism biasing a force against a holder holding the ball joint.

7. The probe of claim 3, wherein the tip portion is fixed to an extension of the ball joint, thereby allowing for the movement of the tip portion upon movement of the ball joint.

8. The probe of claim 1, wherein the rigid portion is adapted to be supported by a rigid holder.

9. The probe of claim 1, wherein the rigid portion further comprises a telescoping mechanism.

* * * * *